(12) United States Patent
Ng et al.

(10) Patent No.: US 11,855,065 B2
(45) Date of Patent: Dec. 26, 2023

(54) STACKED SEMICONDUCTOR DIE ASSEMBLIES WITH SUPPORT MEMBERS AND ASSOCIATED SYSTEMS AND METHODS

(71) Applicant: Micron Technology, Inc., Boise, ID (US)

(72) Inventors: Hong Wan Ng, Singapore (SG); Seng Kim Ye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/409,439

(22) Filed: Aug. 23, 2021

(65) Prior Publication Data
US 2021/0384185 A1 Dec. 9, 2021

Related U.S. Application Data

(60) Continuation of application No. 16/678,195, filed on Nov. 8, 2019, now Pat. No. 11,101,262, which is a
(Continued)

(51) Int. Cl.
*H01L 25/00* (2006.01)
*H01L 25/18* (2023.01)
(Continued)

(52) U.S. Cl.
CPC .......... *H01L 25/50* (2013.01); *H01L 23/3128* (2013.01); *H01L 24/33* (2013.01);
(Continued)

(58) Field of Classification Search
CPC ..... H01L 25/50; H01L 23/3128; H01L 24/33; H01L 24/48; H01L 24/49; H01L 24/83; H01L 24/85
(Continued)

(56) References Cited

U.S. PATENT DOCUMENTS 6,930,378 B1 8/2005 St et al.
7,220,615 B2 5/2007 Bolken
(Continued)

FOREIGN PATENT DOCUMENTS

CN 101095215 A 12/2007
CN 101232011 A 7/2008
(Continued)

OTHER PUBLICATIONS

European Search Report dated May 31, 2021 for European Patent Application No. 20216842.3, 21 pages.
(Continued)

*Primary Examiner* — Dzung Tran
(74) *Attorney, Agent, or Firm* — Perkins Coie LLP

(57) ABSTRACT

Stacked semiconductor die assemblies with support members and associated systems and methods are disclosed herein. In one embodiment, a semiconductor die assembly can include a package substrate, a first semiconductor die attached to the package substrate, and a plurality of support members also attached to the package substrate. The plurality of support members can include a first support member and a second support member disposed at opposite sides of the first semiconductor die, and a second semiconductor die can be coupled to the support members such that at least a portion of the second semiconductor die is over the first semiconductor die.

19 Claims, 10 Drawing Sheets

Related U.S. Application Data continuation of application No. 15/229,651, filed on Aug. 5, 2016, now Pat. No. 10,504,881, which is a division of application No. 14/264,584, filed on Apr. 29, 2014, now Pat. No. 9,418,974.

(51) Int. Cl.
*H01L 25/065* (2023.01)
*H01L 23/00* (2006.01)
*H01L 23/31* (2006.01)

(52) U.S. Cl.
CPC .............. *H01L 24/49* (2013.01); *H01L 24/83* (2013.01); *H01L 24/85* (2013.01); *H01L 25/0657* (2013.01); *H01L 25/18* (2013.01); H01L 24/48 (2013.01); H01L 2224/04042 (2013.01); H01L 2224/05554 (2013.01); H01L 2224/05599 (2013.01); H01L 2224/06135 (2013.01); H01L 2224/32145 (2013.01); H01L 2224/32225 (2013.01); H01L 2224/33181 (2013.01); H01L 2224/48227 (2013.01); H01L 2224/49171 (2013.01); H01L 2224/73265 (2013.01); H01L 2224/8385 (2013.01); H01L 2224/83191 (2013.01); H01L 2224/83201 (2013.01); H01L 2224/85399 (2013.01); H01L 2224/92247 (2013.01); H01L 2225/0651 (2013.01); H01L 2225/06555 (2013.01); H01L 2225/06562 (2013.01); H01L 2225/06593 (2013.01); H01L 2924/00014 (2013.01); H01L 2924/01014 (2013.01); H01L 2924/1033 (2013.01); H01L 2924/10253 (2013.01); H01L 2924/1205 (2013.01); H01L 2924/143 (2013.01); H01L 2924/1434 (2013.01); H01L 2924/1436 (2013.01); H01L 2924/1437 (2013.01); H01L 2924/1438 (2013.01); H01L 2924/15174 (2013.01); H01L 2924/15182 (2013.01); H01L 2924/15184 (2013.01); H01L 2924/15311 (2013.01); H01L 2924/181 (2013.01); H01L 2924/182 (2013.01); H01L 2924/19041 (2013.01); H01L 2924/19042 (2013.01); H01L 2924/19043 (2013.01); H01L 2924/19105 (2013.01)

(58) Field of Classification Search
USPC .......................................................... 438/109
See application file for complete search history.

(56) References Cited

U.S. PATENT DOCUMENTS

| | | | |
|---|---|---|---|
| 8,368,192 B1 | 2/2013 | Chen | |
| 8,378,483 B2 | 2/2013 | Mah | |
| 9,418,974 B2 | 8/2016 | Ng et al. | |
| 10,504,881 B2 | 12/2019 | Ng et al. | |
| 2002/0074668 A1 | 6/2002 | Hofstee et al. | |
| 2002/0096785 A1 | 7/2002 | Kimura | |
| 2003/0038374 A1 | 2/2003 | Shim et al. | |
| 2004/0016939 A1* | 1/2004 | Akiba | H01L 23/544 |
| | | | 257/E21.705 |
| 2004/0075164 A1* | 4/2004 | Pu | H01L 23/3128 |
| | | | 257/E21.503 |
| 2004/0164390 A1 | 8/2004 | Wang et al. | |
| 2005/0196907 A1 | 9/2005 | Ratificar et al. | |
| 2007/0181990 A1 | 8/2007 | Huang et al. | |
| 2008/0054451 A1 | 3/2008 | Bauer et al. | |
| 2008/0233684 A1 | 9/2008 | Chee Peng et al. | |
| 2008/0241995 A1 | 10/2008 | Fukui et al. | |
| 2008/0315404 A1 | 12/2008 | Eichelberger et al. | |
| 2009/0051043 A1 | 2/2009 | Wong et al. | |
| 2009/0115035 A1 | 5/2009 | Bayan et al. | |
| 2009/0154513 A1 | 6/2009 | Shin | |
| 2009/0321907 A1 | 12/2009 | Lee et al. | |
| 2010/0027233 A1 | 2/2010 | Low et al. | |
| 2010/0090350 A1 | 4/2010 | Chow et al. | |
| 2010/0314740 A1 | 12/2010 | Choi et al. | |
| 2011/0156232 A1 | 6/2011 | Youn et al. | |
| 2012/0219262 A1 | 8/2012 | Hendrix et al. | |
| 2012/0317332 A1 | 12/2012 | Kwak et al. | |
| 2012/0319262 A1 | 12/2012 | Kuan et al. | |
| 2013/0032942 A1 | 2/2013 | Sasaki et al. | |
| 2013/0037802 A1 | 2/2013 | England et al. | |
| 2013/0049228 A1 | 2/2013 | Nam et al. | |
| 2013/0105989 A1 | 5/2013 | Pagaila et al. | |
| 2013/0258577 A1 | 10/2013 | Wu et al. | |
| 2015/0311185 A1 | 10/2015 | Ng et al. | |
| 2016/0343699 A1 | 11/2016 | Ng et al. | |
| 2020/0105737 A1 | 4/2020 | Ng et al. | |

FOREIGN PATENT DOCUMENTS

| | | |
|---|---|---|
| CN | 101419963 A | 4/2009 |
| CN | 101661927 A | 3/2010 |
| CN | 102160163 A | 8/2011 |
| CN | 103178036 A | 6/2013 |
| CN | 103229296 A | 7/2013 |
| CN | 103633076 A | 3/2014 |
| JP | 2005327789 A | 11/2005 |
| JP | 2013038106 A | 2/2013 |
| JP | 2013131557 A | 7/2013 |
| KR | 20010073344 A | 8/2001 |
| KR | 100894173 B1 | 4/2009 |
| KR | 20130024567 A | 3/2013 |
| TW | 200837922 A | 9/2008 |
| TW | 201140769 A | 11/2011 |
| TW | 201312723 A | 3/2013 |
| TW | 201348367 A | 12/2013 |
| TW | 201349363 A | 12/2013 |
| TW | I455214 B | 10/2014 |

OTHER PUBLICATIONS

CN Patent Application No. 201580023622.9—Chinese Office Action and Search Report, dated Apr. 18, 2018, with English Translation, 23 pages.
EP Patent Application No. 15785531.3—Extended European Search Report, dated Feb. 2, 2018, 21 pages.
JP Patent Application No. 2016-564565—Japanese Office Action and Search Report, dated Oct. 3, 2017, with English Translation, 10 pages.
JP Patent Application No. 2016-564565—Japanese Office Action, dated Mar. 20, 2018, with English Translation, 6 pages.
KR Patent Application No. 10-2016-7032761—Korean Office Action and Search Report, dated Nov. 14, 2017, with English Translation, 16 pages.
KR Patent Application No. 10-2016-7032761—Korean Office Action, dated Jun. 28, 2018, with English Translation, 8 pages.
Office Action dated Feb. 22, 2019 for China Patent Application No. 201580023622.9.
Office Action dated Feb. 3, 2020 for China Patent Application No. 201580023622.9; 24 pages (with translation).
Office Action dated Jan. 8, 2019 for European Application No. 15785531.3, 8 pages.
Office Action dated Jun. 20, 2019 for China Patent Application No. 201580023622.9; 24 pages (with translation).
Reexamination Notification dated Sep. 29, 2020 for China Patent Application No. 201580023622.9; 23 pages (with translation).
International Search Report dated Aug. 18, 2015 in Application No. PCT/US2015/028138, 18 pages.
Office Action dated Apr. 18, 2017 in Taiwan Application No. 104113105, 18 pages.
Office Action dated Dec. 13, 2016 in Taiwan Application No. 104113105, 27 pages.

(56) References Cited

OTHER PUBLICATIONS

Office Action dated May 4, 2016 in Taiwan Application No. 104113105, 26 pages.

* cited by examiner

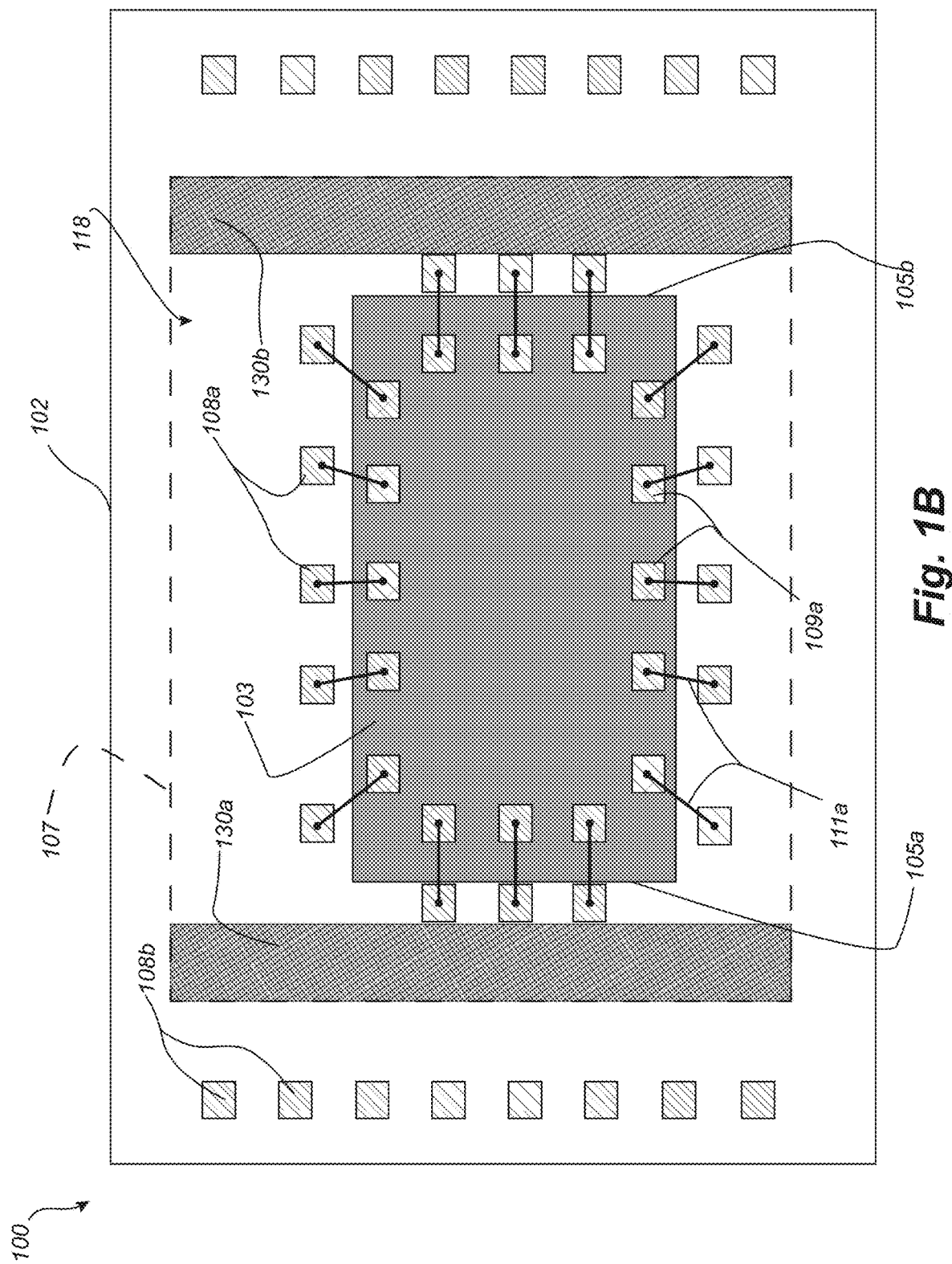

STACKED SEMICONDUCTOR DIE ASSEMBLIES WITH SUPPORT MEMBERS AND ASSOCIATED SYSTEMS AND METHODS

CROSS-REFERENCE TO RELATED APPLICATION(S)

This application is a continuation of U.S. patent application Ser. No. 16/678,195, filed Nov. 8, 2019, now U.S. Pat. No. 11,101,262, which is a continuation of U.S. patent application Ser. No. 15/229,651, filed Aug. 5, 2016, now U.S. Pat. No. 10,504,881, which is a divisional of U.S. patent application Ser. No. 14/264,584, filed Apr. 29, 2014, which issued as U.S. Pat. No. 9,418,974, each of which is incorporated herein by reference in its entirety.

TECHNICAL FIELD

The disclosed embodiments relate to semiconductor die assemblies and to support members in such assemblies. In several embodiments, the present technology relates to die assemblies that can include a controller die and memory dies carried above the controller die.

BACKGROUND

Packaged semiconductor dies, including memory chips, microprocessor chips, and imager chips, can include semiconductor dies mounted on a package substrate. The semiconductor dies are encased in a plastic protective covering, and each die includes functional features, such as memory cells, processor circuits, and imager devices. Bond pads on the dies are electrically connected between the functional features and terminals on the package substrate that allow the dies to be connected to external circuitry.

To increase the density of dies within a package, the dies can be stacked upon one another within the casing. One challenge with vertically stacked dies, however, is that the dies can have different sizes or footprints. For example, in a memory package, a memory controller die can have a smaller footprint than the memory dies within the package. The memory controller die can be more difficult to wirebond because it is offset from the memory dies. Also, the memory dies can sometimes tilt when stacked upon the smaller memory controller die.

BRIEF DESCRIPTION OF THE DRAWINGS

FIG. 1B is a top plan view of the assembly of FIG. 1A with a casing and a semiconductor die stack removed from the assembly.

DETAILED DESCRIPTION

Specific details of several embodiments of stacked semiconductor die assemblies having spacer support members and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat. A person skilled in the relevant art will also understand that the technology may have additional embodiments, and that the technology may be practiced without several of the details of the embodiments described below with reference to FIGS. 1-7.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as being flipped on their side or inverted.

Figure 1A:
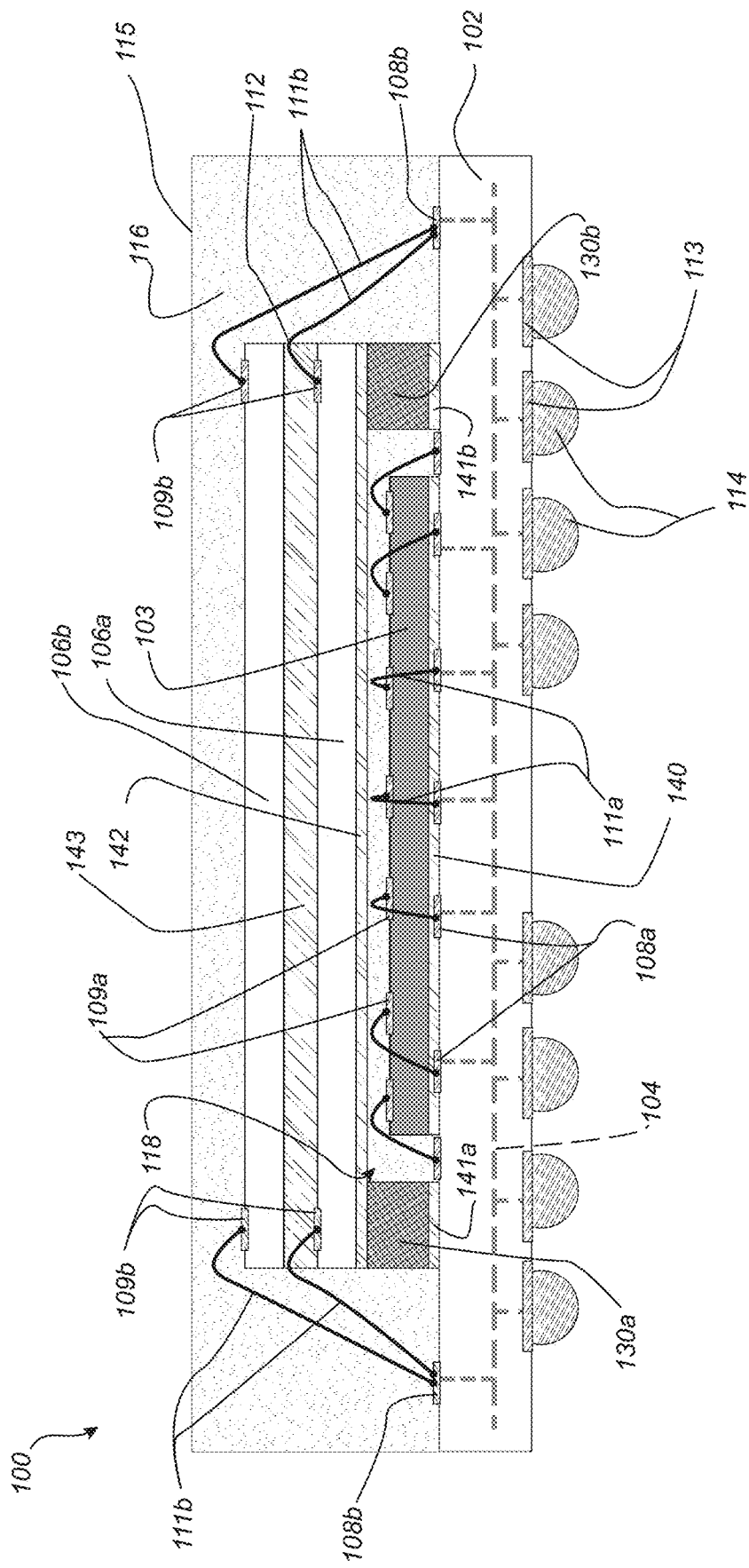
FIG. 1A is a cross-sectional view of a semiconductor die assembly configured in accordance with an embodiment of the present technology.

FIG. 1A is a cross-sectional view of a semiconductor die assembly 100 ("assembly 100") configured in accordance with an embodiment of the present technology. As shown, the assembly 100 includes a package substrate 102 carrying a first semiconductor die, or controller die 103, and first and second support members 130a and 130b (collectively "support members 130") on opposite sides of the controller die 103. The support members 130 carry first and second semiconductor dies, or first and second memory dies 106a and 106b (collectively "memory dies 106"), arranged in a stack above the controller die 103. The package substrate 102 includes a plurality of first bond pads 108a within the footprint (e.g., directly beneath) the first memory die 106a and a plurality of second bond pads 108b outside of the footprint (e.g., not directly beneath) the first memory die 106a. The first bond pads 108a are coupled to corresponding bond pads 109a on the controller die 103 by first wire bonds 111a, and the second bond pads 108b are coupled to corresponding bond pads 109b on each of the memory dies 106 by second wire bonds 111b. The package substrate 102 can include, for example, a printed circuit board or other suitable substrate having electrical connectors 104 (shown schematically), such as metal traces, vias, or other suitable connectors. The electrical connectors 104 can couple the first bond pads 108a and/or the second bond pads 108b to external circuitry (not shown) via package contacts 113 and interconnects 114 (e.g., bump bonds) at the opposite side of the package substrate 102. In several embodiments, the electrical connectors 104 can also couple individual first bond pads 108a with individual second bond pads 108b to electrically intercouple the controller die 103 with the memory dies 106.

The assembly 100 further includes a package casing 115 composed of an encapsulant 116 that at least partially encapsulates the controller die 103, the memory dies 106, and the support members 130. In the illustrated embodiment, the encapsulant 116 also extends into a cavity 118 between the package substrate 102 and the first memory die 106a to at least partially fill the region beneath the first memory die 106a not occupied by the controller die 103 and the support members. In some embodiments, the portion of the encapsulant 116 in the cavity 118 can reinforce the support members 130 and provide further mechanical support beneath the first memory die 106a. The encapsulant 116 can include, for example, a thermoset material, an epoxy resin, or other suitable compound that provides mechanical support, shielding from the ambient environment (e.g., from humidity), and/or electrical isolation (e.g., between wire bonds).

The controller die 103 and the memory dies 106 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a memory in which the memory dies 106 provide data storage (e.g., NAND dies) and the controller die 103 provides memory control (e.g., NAND control). In some embodiments, the assembly 100 can include other semiconductor dies in addition to and/or in lieu of one or more of the controller die 103 and/or the memory dies 106. For example, instead of two memory dies, the assembly 100 can include more than two memory dies (e.g., four dies, eight dies, etc.) or only a single memory die. Further, in various embodiments, the dies of the assembly 100 can have different sizes. For example, in some embodiments one or both of the memory dies 106 can extend beyond the support members 130 at one or more sides.

As further shown in FIG. 1A, the controller die 103 is attached to the package substrate 102 by a die-attach material 140 (e.g., a die-attach film). The first support member 130a is attached to the package substrate 102 by a die-attach material 141a, and the second support member 130b is attached to the package substrate 102 by a die-attach material 141b. The memory dies 106, in turn, are attached to the controller die 103 and the support members 130 by a die-attach material 142 and to one another by a film-over-wire material 143 ("over-wire material 142"). In several embodiments, the die-attach materials 140, 141a-b, and 142 can be formed from the same or similar materials. In some embodiments, the over-wire material 143 can be formed from the same or similar materials 140, 141a-b, and 142, but the over-wire material 143 can have a greater thickness to accommodate a wire portion 112 of the first wire bonds 111a between the memory dies 106. In selected embodiments, the die-attach materials 140, 141a-b, and 142 and the over-wire material 143 can each include a laminate film of epoxy-based material. Such laminate films can include, for example, a die-attach film or a dicing-die-attach film (known to those skilled in the art as "DAFs" or "DDFs," respectively). In one embodiment the die-attach materials and/or film-over wire materials can each include DAFs or DDFs provided by Henkel AG & Co. of Shangai, China (e.g., Model Nos. Ablestick ATB-100, 100U, 100A, 100U).

In some conventional package assemblies, the controller die can be positioned between the package substrate and a stack of memory dies. This configuration is typically formed by encapsulating the controller die with an encapsulant and then the memory dies are stacked upon the surface of the encapsulant. One challenge with encapsulating the controller die at this stage, however, is that it complicates manufacturing. For example, the mounting surface on the encapsulant can be uneven. When the memory dies are stacked on an uneven mounting surface, they can cant or tilt to the extent that the dies project outside of the protective casing. Also, die tilt can make wirebonding more difficult because the wire bonds have different lengths at the opposite sides of the assembly. Another conventional manufacturing technique involves forming a cavity in the package substrate into which the controller die can be inserted. This technique can also complicate manufacturing and increase costs because it requires the package substrate to be milled or etched to form the cavity.

Embodiments of die assemblies configured in accordance with several embodiments of the present technology can address these and other limitations of conventional die assemblies. For example, one advantage is that the stack of memory dies 106 can be mounted to the support members 130 without having to first encapsulate the controller die 103 beneath the memory dies 106. A related advantage is that the high temperature molding and curing steps for encapsulating the controller die can be eliminated and thus reduce thermal cycling. Accordingly, manufacturing can be less complicated because it can eliminate several manufacturing steps. Another advantage is that the support members 130 can have a coefficient of thermal expansion (CTE) that is similar to or the same as the memory dies 106. For example, the support members 130 can be formed from semiconductor materials, such as silicon. Such CTE matching reduces thermal stresses within the package during operation. Yet another advantage is that the memory dies 106 are not prone to tilt because the support members 130 can have the same height and the die-attach materials 140, 141a-b, and 142 can be formed from a laminate film with a uniform thickness.

FIG. 1B is a top plan view of the assembly 100 with the casing 115 and the memory dies 106 shown in FIG. 1A removed for purposes of illustration. As shown, the controller die 103 is located within a perimeter, or footprint 107 (shown in hidden lines), of the stack of memory dies 106 (FIG. 1A) superimposed on the package substrate 102. The first and second support members 130a and 130b are also positioned within the footprint 107 and extend along first and second sides 105a and 105b, respectively, of the controller die 103. In several embodiments, the support members 130 can each include an elongate member formed from an interposer substrate, a printed circuit board, a semiconductor wafer or die, or another suitable support material. In one embodiment described in greater detail below, the support members 130 can be pieces of semiconductor material that are cleaved (e.g., diced or singulated) from a semiconductor wafer or die, such as a "blank" silicon wafer or die.

Figure 2:
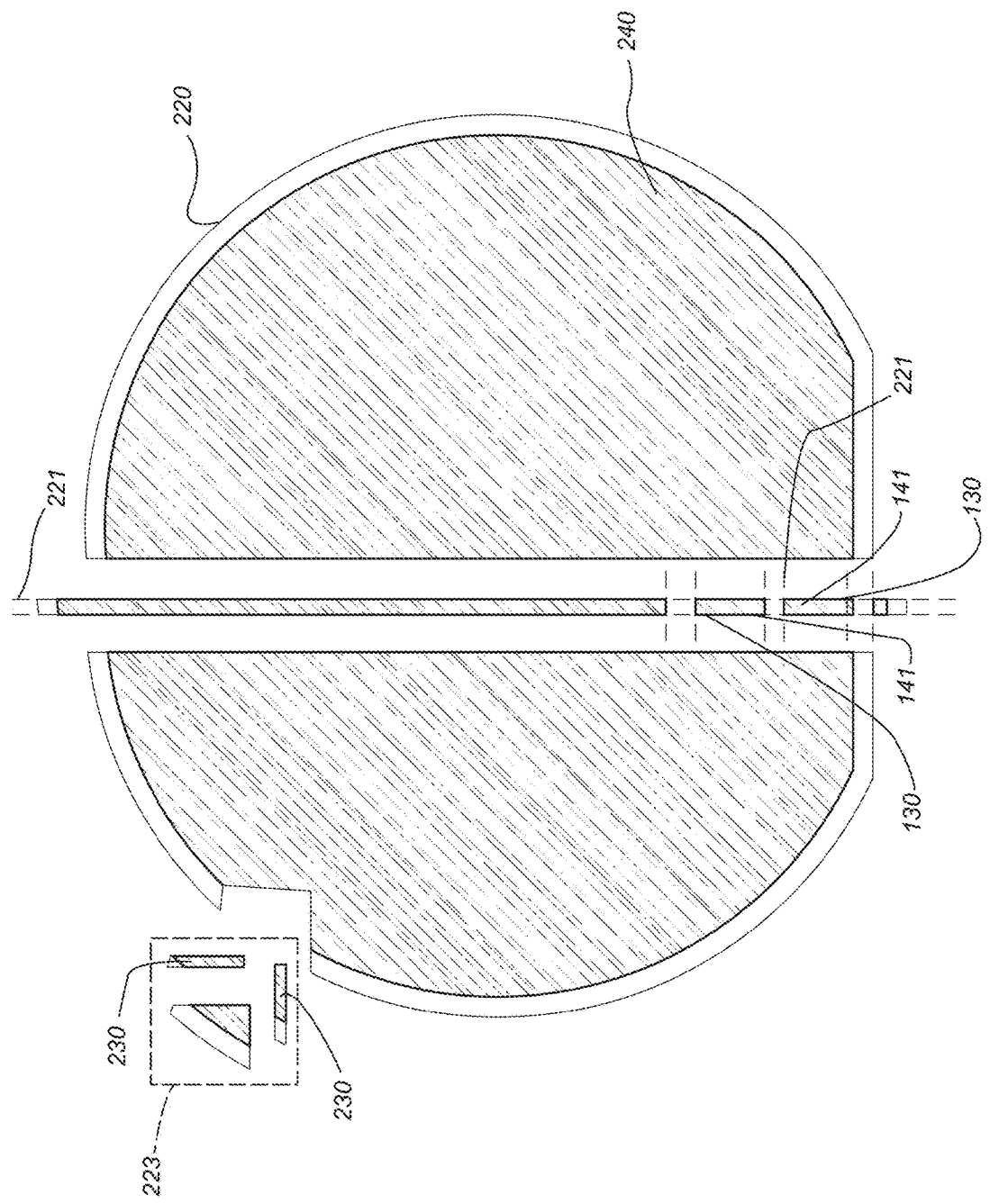
FIG. 2 is a top plan view of a semiconductor wafer that has been cleaved to form support members of the semiconductor die assembly in accordance with an embodiment of the present technology.

FIG. 2 is a top plan view of a semiconductor wafer 220 that has been cleaved to form the support members 130 with die attach materials 141 in accordance with an embodiment of the present technology. In the illustrated embodiment, the support members 130 are formed by first covering the semiconductor wafer 220 with a die-attach material 240

(e.g., a die-attach film) and then simultaneously cutting the wafer 220 and the die-attach material 240 along multiple dicing lines 221. Once cut, the support members 130 can then be attached to the package substrate 102 (FIG. 1A) via the die-attach materials 141 formed from the respective portions of die-attach material 240. In one embodiment, the support members 130 can be formed from a blank silicon wafer. In another embodiment, support members can be formed from portions of a semiconductor wafer that might otherwise be discarded. For example, support members 230 can be formed from an edge portion 223 of the semiconductor wafer 220 left over after die singulation. In additional or alternate embodiments, non-yielding or non-functioning dies can also be cut into multiple pieces to form individual spacer members.

Figure 3A:
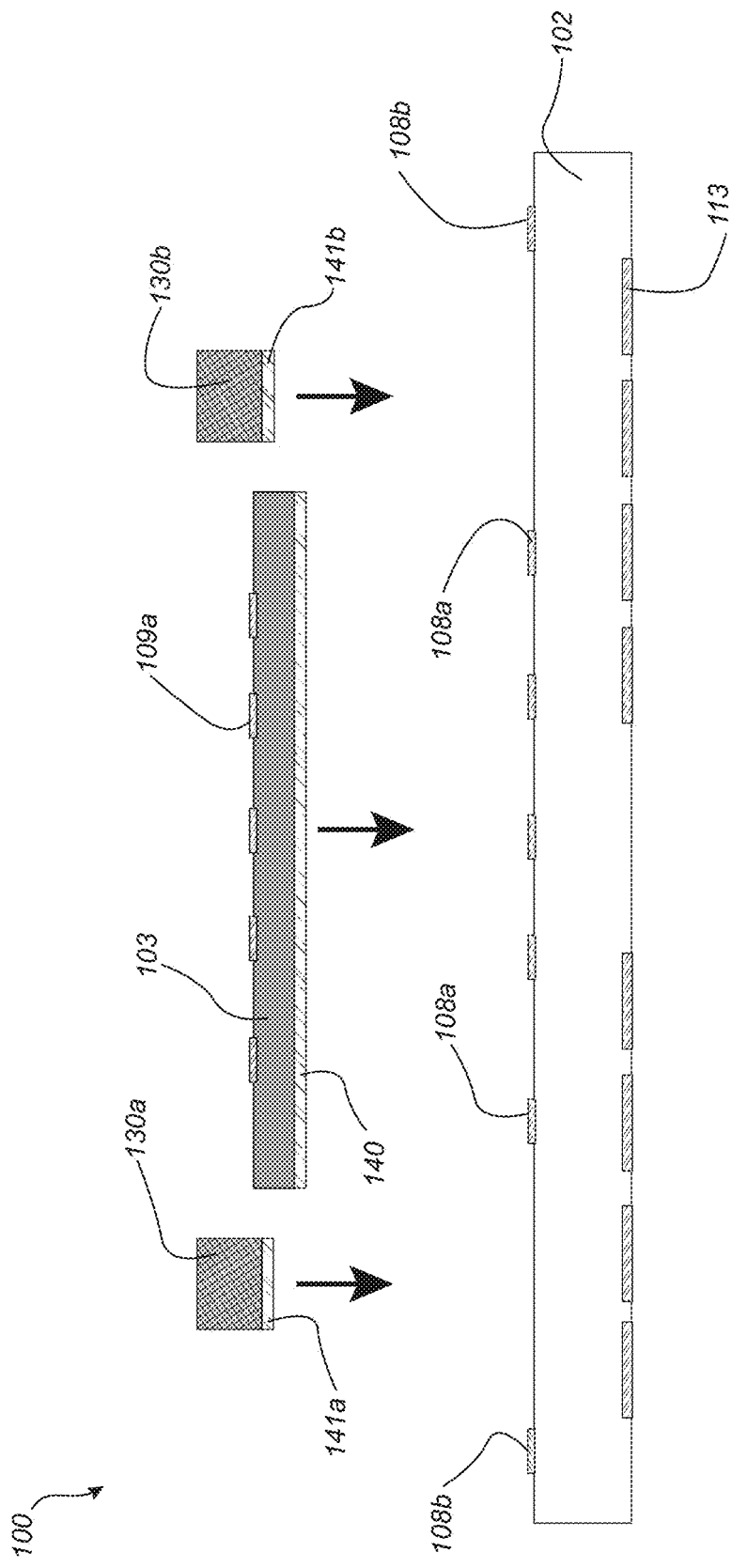
FIGS. 3A-3C are cross-sectional views illustrating the semiconductor die assembly of FIG. 1A at various stages of manufacture in accordance with an embodiment of the present technology.
Figure 3B:
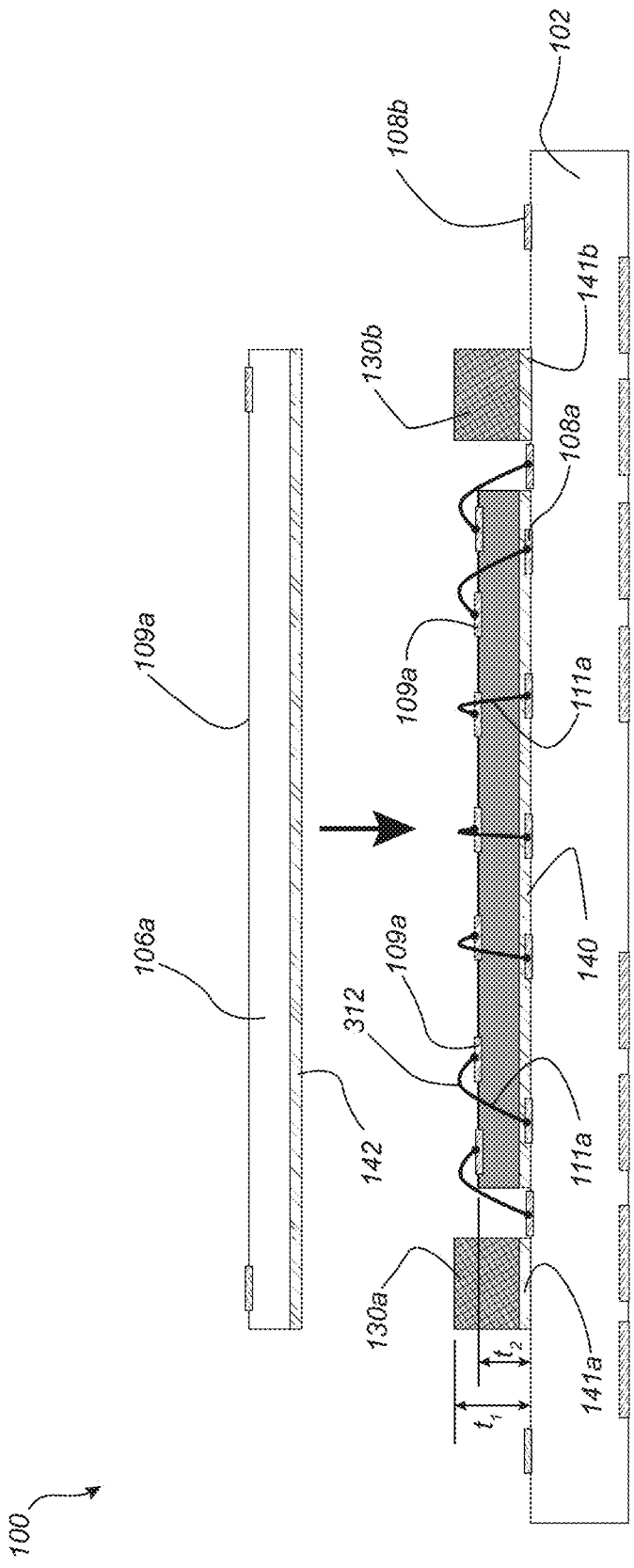
Figure 3C:
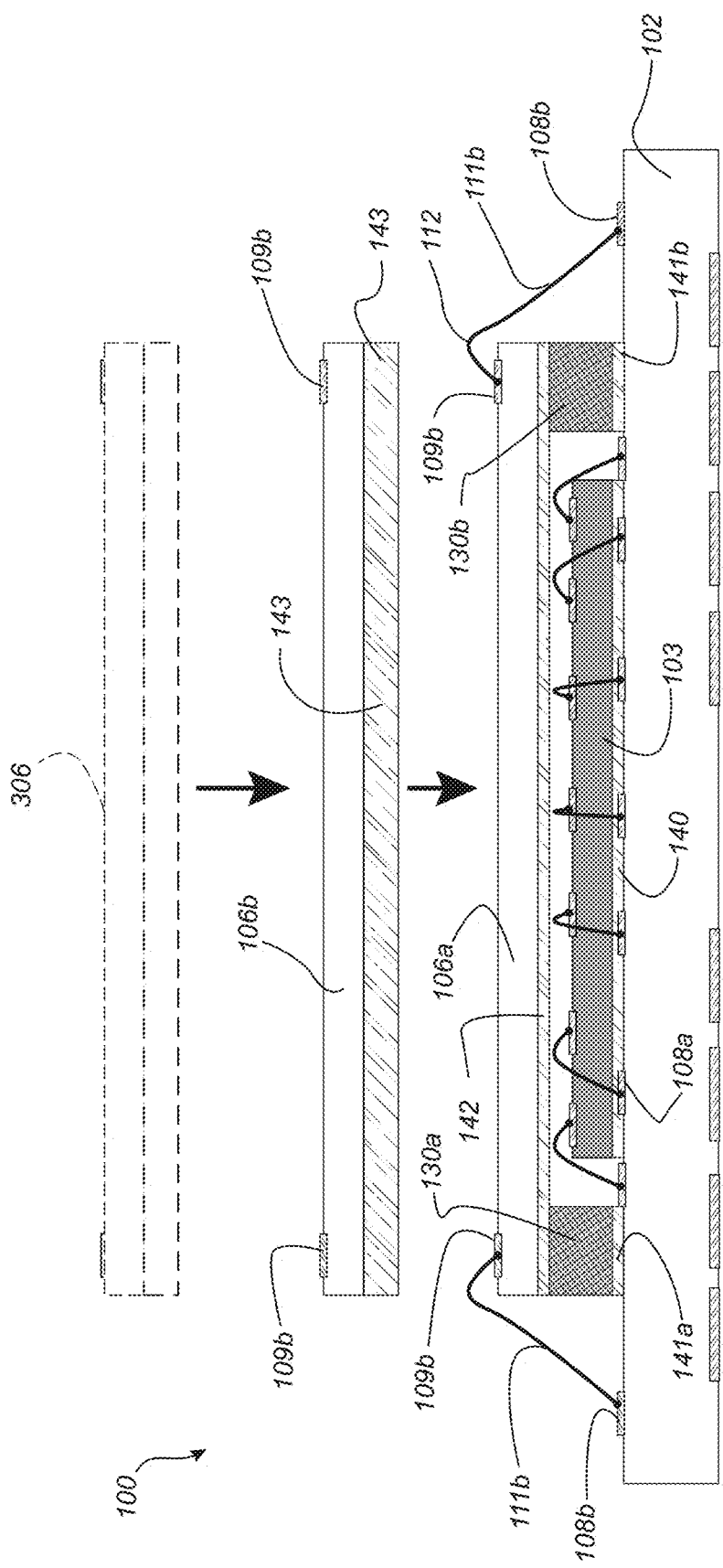

FIGS. 3A-3C are cross-sectional views illustrating the assembly 100 at various stages of manufacture in accordance with an embodiment of the present technology. Referring first to FIG. 3A, the controller die 103 is attached to the package substrate 102 with the die-attach material 140, and the first and second support members 130a-b are attached to the package substrate with die-attach materials 141a-b, respectively. In one embodiment, one or more of the die-attach materials 140 and 141a-b can include a pressure-set film that adheres materials together when it is compressed (e.g., between the package substrate 102 and each of the support members 130) beyond a threshold level of pressure. In another embodiment, one or more of the die-attach materials 140 and 141a-b can be a UV-set film that is set by exposure to UV radiation.

FIG. 3B shows the assembly 100 after forming the first wirebonds 111a between the first bond pads 108a of the package substrate 102 and the corresponding bond pads 109a of the controller die 103. As shown, the support members 130 can have a first thickness $t_1$ that is greater than a second thickness $t_2$ of the controller die 103. In several embodiments, the first and second thicknesses $t_1$ and $t_2$ can be selected such that a wire portion 312 of each of the first wirebonds 111a does not contact the die-attach material 142 when the first memory die 106a is mounted to the support members 130. In another embodiment, the thicknesses $t_1$ and $t_2$ can be selected such that the wire portion 312 projects at least partially into the die-attach material 142. In either case, once the first wirebonds 111a are formed, the first memory die 106a can be attached to the support members 130 via the die-attach material 142.

FIG. 3C shows the assembly 100 after forming the second wirebonds 111b between the second bond pads 108b of the package substrate 102 and the corresponding bond pads 109b of the first memory die 106a. After the second wirebonds 111b are formed, the second memory die 106b can be attached to the first memory die 106a with the over-wire material 143. Once the memory dies 106 are attached to one another, processing can continue with subsequent manufacturing stages. For example, processing can continue by wire bonding the second memory die 106b to the package substrate 102 and then molding the package casing 115 (FIG. 1A) over the die stack. In some embodiments, one or more additional memory dies 306 (shown in hidden lines) can be stacked above the second memory die 106b and wirebonded to the second bond pads 108b of the package substrate 102.

Figure 4:
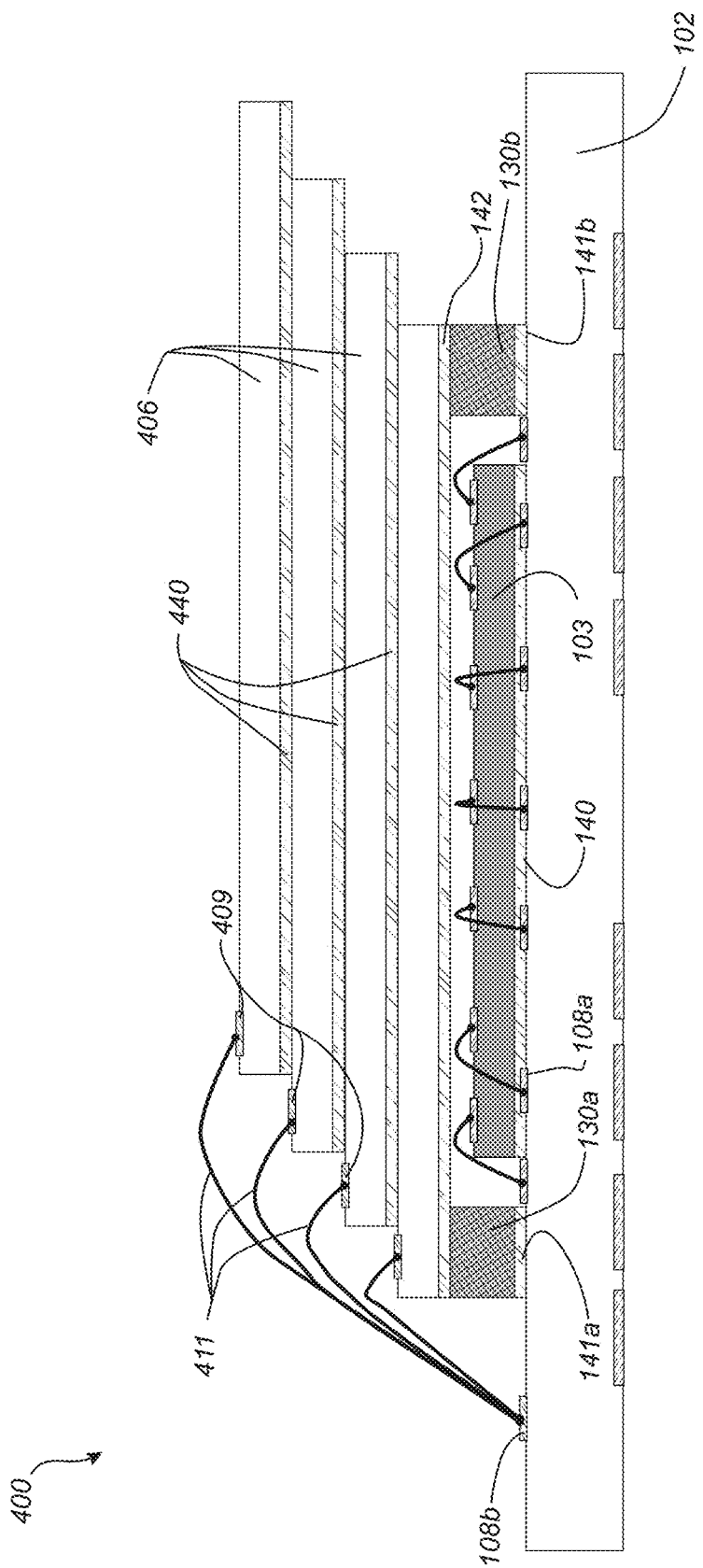
FIG. 4 is a cross-sectional view of a semiconductor die assembly configured in accordance with another embodiment of the present technology.

FIG. 4 is a cross-sectional view of a semiconductor die assembly 400 ("assembly 400") configured in accordance with another embodiment of the present technology. The assembly 400 can include features generally similar to those of the assembly 100 described in detail above. For example, the assembly 400 includes the controller die 103 and the support members 130 attached to the package substrate 120 by the die-attach materials 140 and 141a-b. In the arrangement shown in FIG. 4, individual memory dies 406 are staggered such that individual bond pads 409 of the memory dies 406 are exposed along at least one edge of the stack of memory dies 406. In one aspect of this embodiment, wirebonds 411 can be bonded to the exposed bond pads 409 such that they are not covered by a film-over-wire material (e.g., the over-wire material 143 of FIG. 1A). As such, the memory dies 406 can be assembled using a relatively thinner die-attach material 440 than a film-over-wire material. Also, the stack of memory dies 406 can have a smaller height than a stack of the same number of memory dies attached together with the thicker film-over-wire material.

Figure 5:
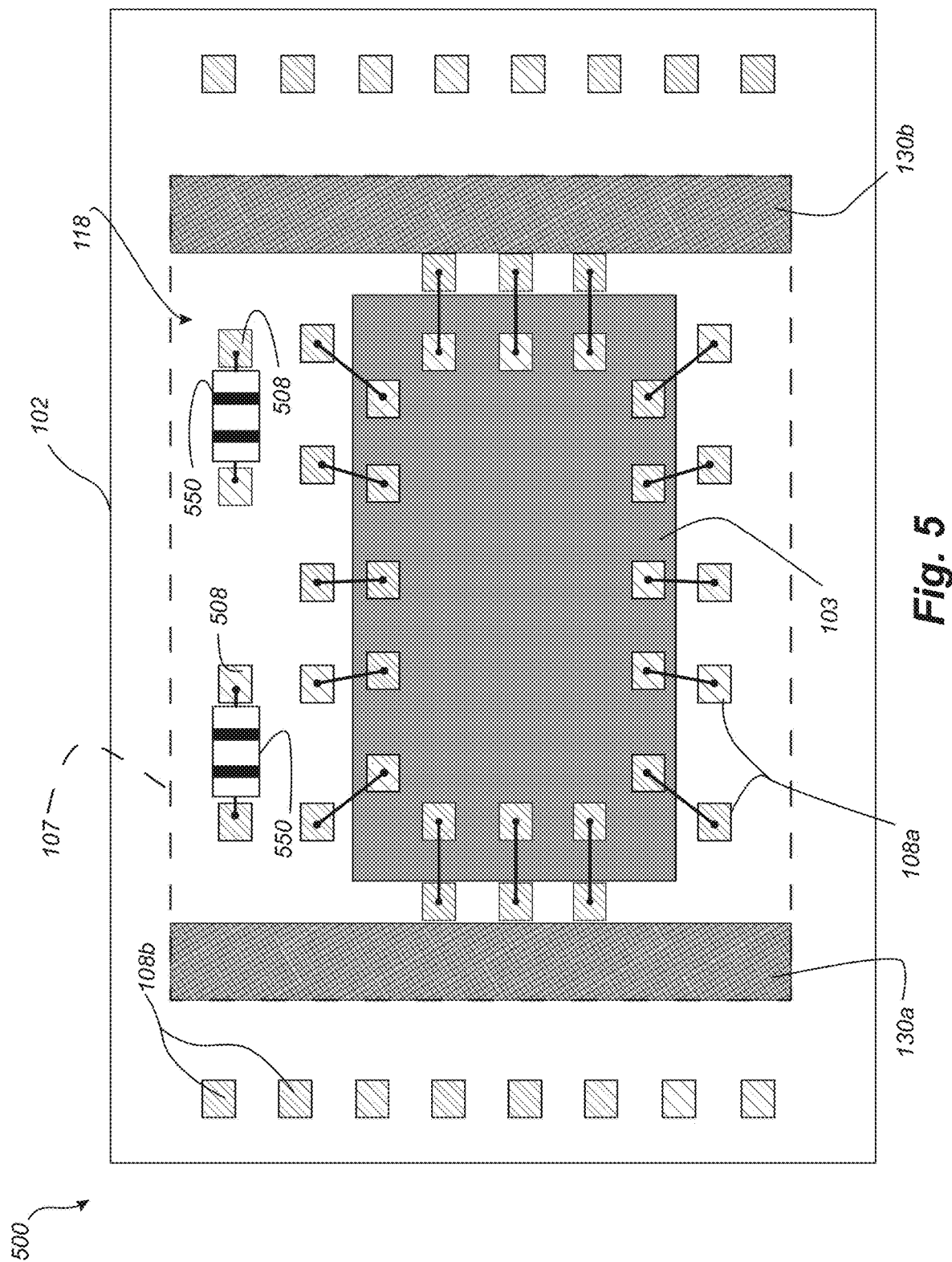
FIG. 5 is a top plan view of a semiconductor die assembly configured in accordance with another embodiment of the present technology.

FIG. 5 is a top plan view of a semiconductor die assembly 500 ("assembly 500") configured in accordance with another embodiment of the present technology. The assembly 500 can include features generally similar to those of the assemblies described in detail above. For example, the assembly 500 includes the controller die 103 positioned within the footprint 107 of the memory dies 106 (FIG. 1A). In the illustrated embodiment of FIG. 5, the assembly 500 can also include capacitors 550 also within the footprint 107 and coupled to the package substrate 102 via bond pads 508. The capacitors 550 can include, for example, monolithic (e.g., ceramic), integrated circuit, or other suitable capacitor devices. In several embodiments, the capacitors 550 can be configured to condition power signals or facilitate power-up. In other embodiments, the assembly 500 can include additional or alternate circuit elements (e.g., inductors, resistors, and/or diodes) and/or circuit components, such as another semiconductor dies at least partially within the footprint 107.

Figure 6A:
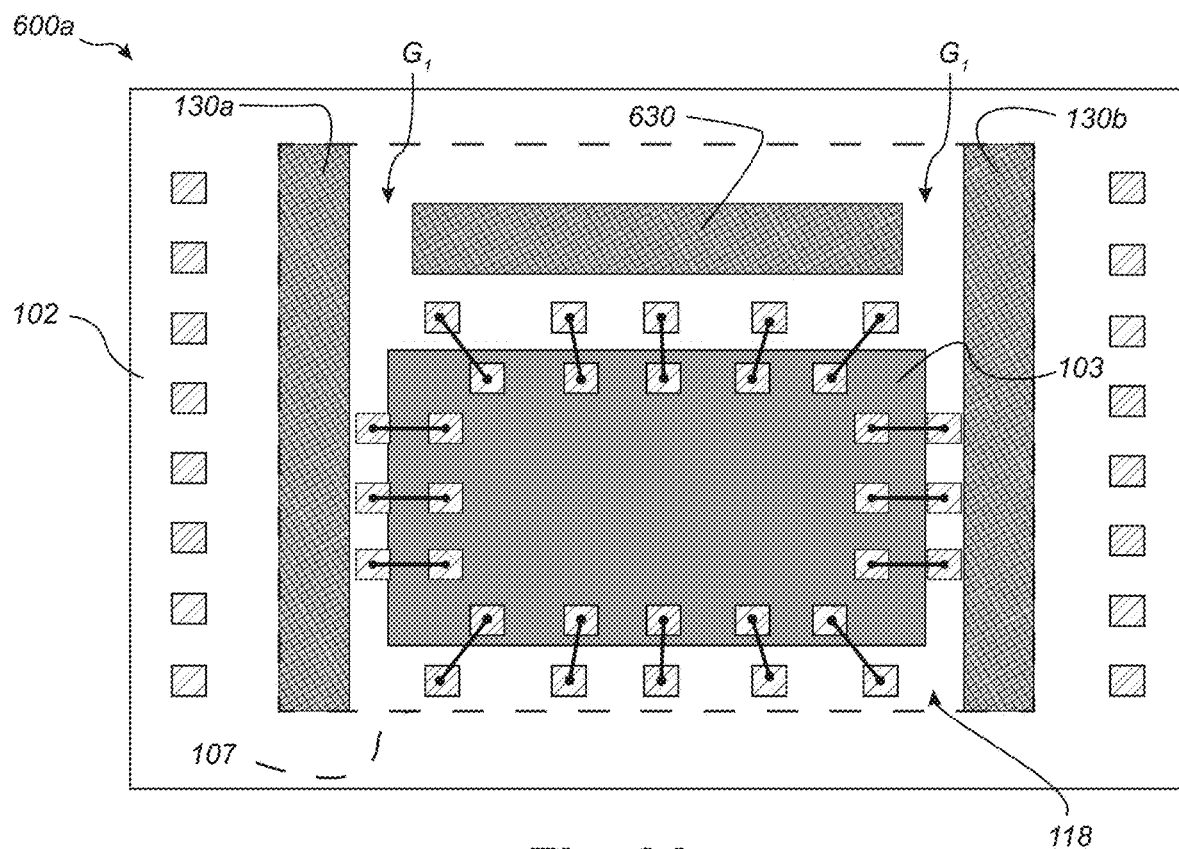
FIGS. 6A and 6B are top plan views illustrating semiconductor die assemblies configured in accordance with several embodiments of the present technology.
Figure 6B:
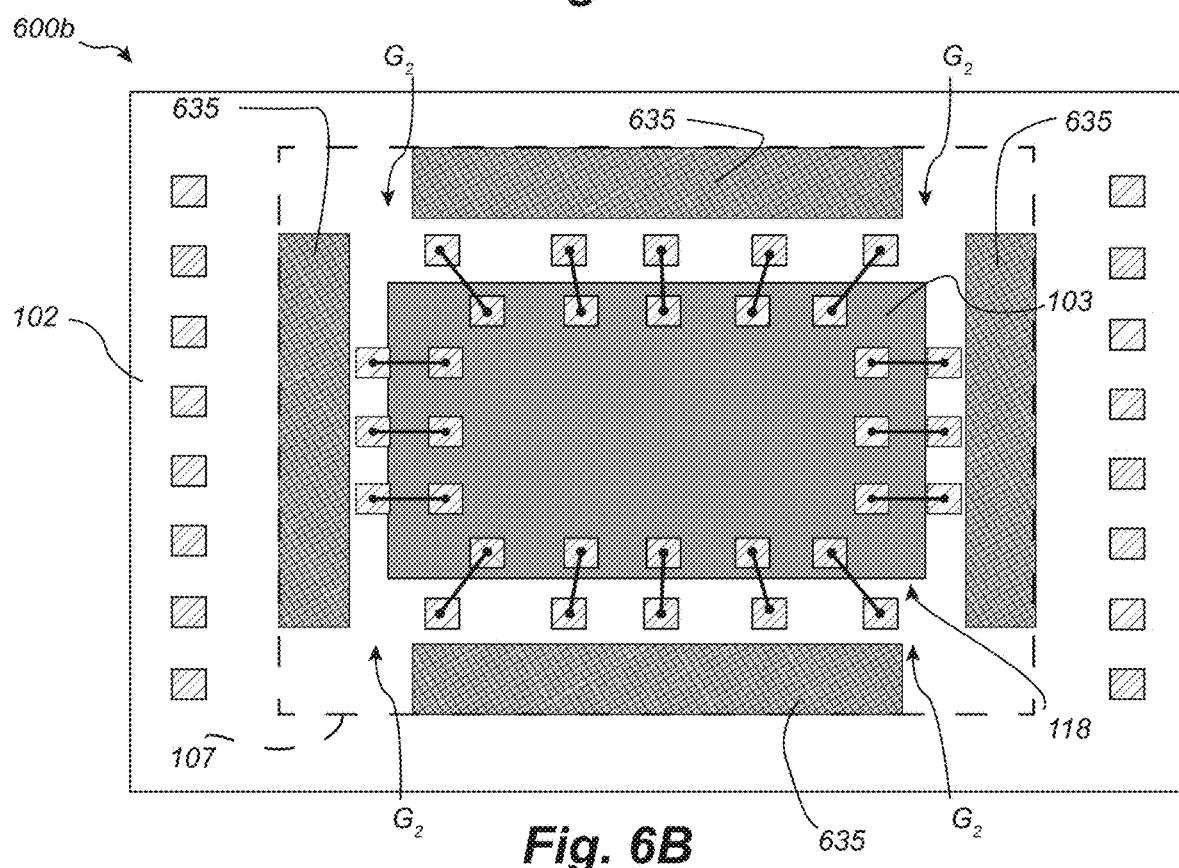

FIGS. 6A and 6B are top plan views illustrating semiconductor die assemblies 600a and 600b, respectively, configured in accordance with several embodiments of the present technology. The assemblies 600a and 600b can each include features generally similar to those of the assemblies described in detail above. For example, the semiconductor die assemblies 600a and 600b can each include the cavity 118 between the package substrate 102 and the memory dies 106 (FIG. 1A) formed by the support members 130.

Referring to FIG. 6A, the semiconductor die assembly 600a includes a third support member 630 (e.g., an elongate member) extending in a direction generally transverse to each of the support members 130. In one aspect of this embodiment, the third support member 630 can be spaced apart from the support members 130 by gaps $G_1$ on opposite sides of the third support member 630 to facilitate flow of the encapsulant 116 into the cavity 118 to form the casing 115 (FIG. 1A). Referring to FIG. 6B, the semiconductor die assembly 600b can include support members 635 positioned at each side the controller die 103. Similar to the third support member 630 shown in FIG. 6A, the support members 635 can be separated from the support members by gaps $G_2$ to facilitate flow of the encapsulant 116 into the cavity 118.

Figure 7:
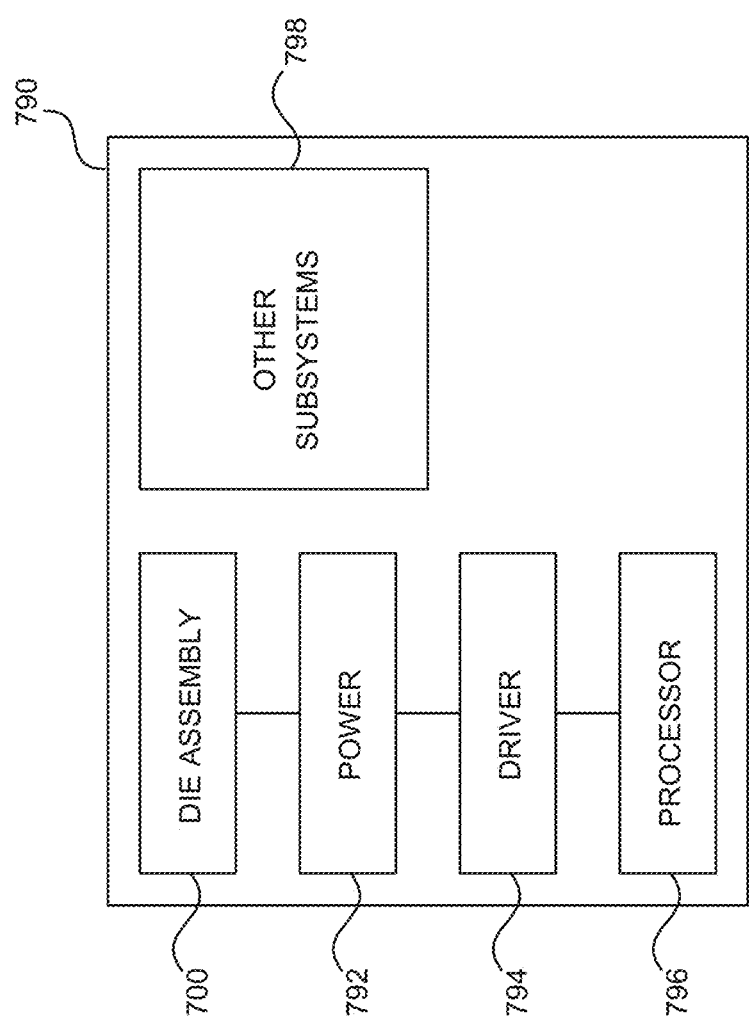
FIG. 7 is a schematic view of a system that includes a semiconductor die assembly configured in accordance with embodiments of the present technology.

Any one of the stacked semiconductor die assemblies described above with reference to FIGS. 1-6B can be incorporated into any of a myriad of larger and/or more complex systems, a representative example of which is system 790 shown schematically in FIG. 7. The system 790 can include a semiconductor die assembly 700, a power source 792, a driver 794, a processor 796, and/or other subsystems or components 798. The semiconductor die assembly 700 can include features generally similar to those of the stacked semiconductor die assemblies described above. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, and appliances. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the technology have been described herein for purposes of illustration, but that various modifications may be made without deviating from the disclosure. Also, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method, comprising:
    attaching a first semiconductor die to a package substrate including a set of substrate bond pads, wherein the first semiconductor die includes a plurality of first die bond pads;
    attaching a first support member to the package substrate, the first support member located apart from a first edge of the first semiconductor die by a first space, wherein the first support member has a first long axis substantially parallel to the first edge;
    attaching a second support member to the package substrate, the second support member located apart from a second edge of the first semiconductor die by a second space, wherein the second edge is opposite to the first edge and the second support member has a second long axis substantially parallel to the first long axis;
    attaching a third support member to the package substrate, the third support member located apart from a third edge of the first semiconductor die by a third space, wherein the third support member has a third long axis substantially perpendicular to the first and second long axes, and wherein the third support member is spaced apart from each of the first and second support members;
    forming a first group of wire bonds electrically coupling a first subset of the substrate bond pads located in the first, second, and third spaces to a corresponding first subset of the plurality of first die bond pads;
    forming a second group of wire bonds electrically coupling a second subset of substrate bond pads located next to a fourth edge of the first semiconductor die opposite the third edge to a corresponding second subset of the plurality of first die bond pads; and
    attaching a second semiconductor die to the first, second, and third support members using a die-attach film, wherein a footprint of the second semiconductor die wholly comprises the first semiconductor die, the first support member next to a first border of the footprint, the second support member next to a second border of the footprint, the third support member next to a third border of the footprint, and a fourth space located between a fourth border of the footprint and the fourth edge of the first semiconductor die, the fourth space including the second subset of substrate bond pads, and wherein the die-attach film extends between the second semiconductor die and the first semiconductor die without attaching the second semiconductor die to the first semiconductor die, and between the second semiconductor die and each of the first, second, and third support members.

2. The method of claim 1, wherein the fourth space includes a first dimension corresponding to a first distance between the first support member and the second support member, and a second dimension corresponding to a second distance between the fourth edge of the first semiconductor die and the fourth border of the footprint, and wherein the second dimension is perpendicular to the first dimension.

3. The method of claim 2, wherein the fourth space is exclusive of a support member.

4. The method of claim 1, wherein one or more wire bonds of the first group project at least partially into the die-attach film.

5. The method of claim 1, wherein one or more wire bonds of the second group project at least partially into the die-attach film.

6. The method of claim 1, further comprising:
    forming a package casing that includes an encapsulant at least partially extending into a cavity underneath the second semiconductor die, the cavity defined by the first, second, and third support members, the second semiconductor die, and the package substrate.

7. The method of claim 6, wherein the encapsulant surrounds one or more wire bonds of the first and second groups of wire bonds, and supports the second semiconductor die.

8. The method of claim 1, wherein the second semiconductor die corresponds to a memory die comprising memory circuitry configured to provide data storage, and the first semiconductor die corresponds to a controller die comprising logic circuitry configured to provide memory control.

9. The method of claim 1, wherein the second semiconductor die corresponds to a NAND die.

10. The method of claim 1, further comprising:
    a third semiconductor die located above the second semiconductor die, wherein a first edge of the third semiconductor die is offset with respect to a first edge of the second semiconductor die.

11. The method of claim 1, wherein each of the first, second, and third support members has a first height that is greater than a second height of the first semiconductor die.

12. The method of claim 1, further comprising, attaching one or more circuit components including a capacitor, an inductor, a resistor, a diode, or a combination thereof to a third subset of the set of substrate bond pads.

13. The method of claim 1, wherein each of the first, second, and third support members comprises silicon.

14. The method of claim 1, wherein the die-attach film includes a pressure-set film.

15. A method, comprising:
    attaching a controller die to a package substrate including a set of substrate bond pads, wherein the controller die includes a plurality of controller die bond pads;
    attaching a first support member to the package substrate, the first support member located apart from a first edge of the controller die by a first space, wherein the first support member has a first long axis substantially parallel to the first edge;

attaching a second support member to the package substrate, the second support member located apart from a second edge of the controller die by a second space, wherein the second edge is opposite to the first edge and the second support member has a second long axis substantially parallel to the first long axis;

attaching a third support member to the package substrate, the third support member located apart from a third edge of the controller die by a third space, wherein the third support member has a third long axis substantially perpendicular to the first and second long axes, and wherein the third support member is spaced apart from each of the first and second support members;

forming a first group of wire bonds electrically coupling a first subset of the substrate bond pads located in the first, second, and third spaces to a corresponding first subset of the plurality of controller die bond pads;

forming a second group of wire bonds electrically coupling a second subset of substrate bond pads located next to a fourth edge of the controller die opposite the third edge to a corresponding second subset of the plurality of controller die bond pads; and attaching a first memory die to the first, second, and third support members using a die-attach film, wherein a footprint of the first memory die wholly comprises the controller die, the first support member next to a first border of the footprint, the second support member next to a second border of the footprint, the third support member next to a third border of the footprint, and a fourth space located between a fourth border of the footprint and the fourth edge of the controller die, the fourth space including the second subset of substrate bond pads, and wherein the die-attach film extends between the first memory die and the controller die without attaching the first memory die to the controller die, and between the first memory die and each of the first, second, and third support members.

16. The method of claim 15, further comprising:

forming a third group of wire bonds electrically coupling a third subset of substrate bond pads to one or more memory bond pads of the first memory die, wherein the third subset of substrate bond pads is located between the footprint of the first memory die and a border of the package substrate.

17. The method of claim 16, further comprising:

attaching a second memory die to the first memory die, wherein a first edge of the second memory die is offset by a fifth space with respect to a first edge of the first memory die, wherein the fifth space includes the one or more memory bond pads of the first memory die.

18. The method of claim 17, wherein the first and second memory dies comprise NAND dies, respectively.

19. The method of claim 17, wherein the die-attach film is a first die-attach film, and wherein the second memory die is attached to the first memory die using a second die-attach film.

* * * * *